United States Patent [19]

Frosien et al.

[11] 4,164,658
[45] Aug. 14, 1979

[54] CHARGED-PARTICLE BEAM OPTICAL APPARATUS FOR IMAGING A MASK ON A SPECIMEN

[75] Inventors: Jürgen Frosien; Burkhard Lischke; Andreas Oelmann, all of Berlin, Fed. Rep. of Germany

[73] Assignee: Siemens Aktiengesellschaft, Munich, Fed. Rep. of Germany

[21] Appl. No.: 870,637

[22] Filed: Jan. 19, 1978

[30] Foreign Application Priority Data

Jan. 20, 1977 [DE] Fed. Rep. of Germany ....... 2702444

[51] Int. Cl.² .......................................... H01J 37/00
[52] U.S. Cl. ................................ 250/492 A; 250/397
[58] Field of Search ................. 250/398, 397, 492 A, 250/505, 311; 219/121 EB, 121 EM; 313/361

[56] References Cited

U.S. PATENT DOCUMENTS 3,736,425  5/1973  Chernow .................. 250/492 A
3,876,883  4/1975  Broers et al. ................... 250/398

*Primary Examiner*—Bruce C. Anderson
*Attorney, Agent, or Firm*—Kenyon & Kenyon

[57] ABSTRACT

An improved charged-particle beam optical apparatus for imaging a first mask including a plurality of apertures on a specimen to be irradiated. The mask is uniformly illuminated by a beam through a plurality of condenser lenses and the apparatus includes means for adjusting the position of the mask relative to the specimen. A selected area of the specimen has an adjustment marking disposed thereon which is illuminated by a ray of charged particles from the beam passing through a test opening provided in the mask. The apparatus further includes means for detecting radiation emanating from the specimen. The improvement of the invention comprises the provision of a second mask, having at least one aperture which is alignable with the test opening in the first mask, mounted in the apparatus and movable into positions above and below the first mask for aligning the test opening and aperture in the first and second masks and covering the plurality of apertures in the first mask so as to permit charged particles from the beam to pass only through the test opening in the first mask and the aperture in the second mask.

2 Claims, 1 Drawing Figure

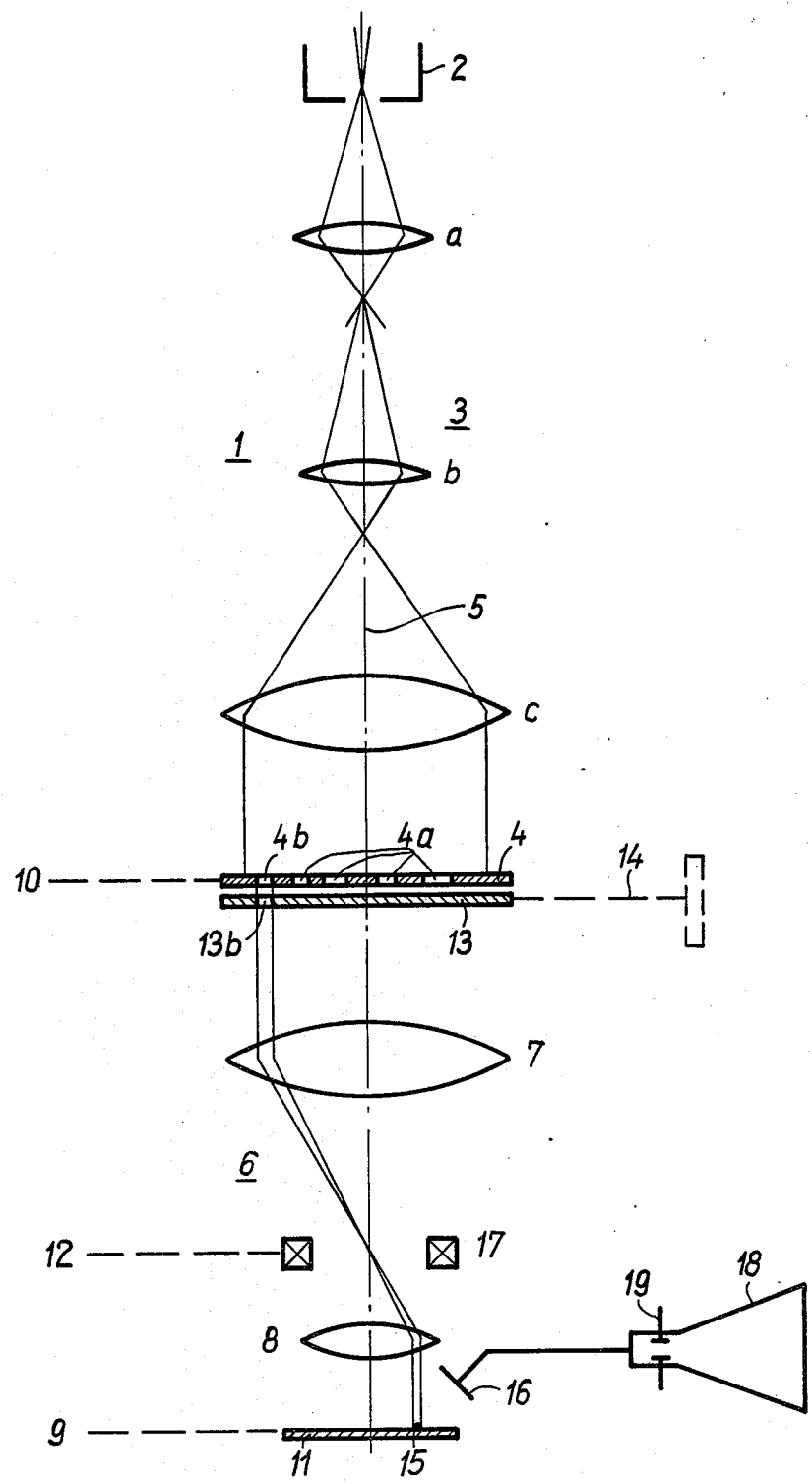

CHARGED-PARTICLE BEAM OPTICAL APPARATUS FOR IMAGING A MASK ON A SPECIMEN

BACKGROUND OF THE INVENTION

1. Field of the Invention

The present invention relates to a charged-particle beam optical apparatus for imaging a first mask including a plurality of apertures on a specimen to be irradiated, the mask being uniformly illuminated by a beam through a plurality of condenser lenses, and which includes means for adjusting the position of the mask relative to the specimen, a selected area of the specimen having an adjustment marking disposed thereon which is illuminated by a ray of charged particles of the beam passing through a test opening provided in the mask, and means for detecting radiation emanating from the specimen.

2. Description of the Prior Art

Charged-particle beam optical apparatus of the foregoing type are known in the art. See, for example, the paper by Heritage, J. Vac. Sci. Technol., Vol. 12 (1975), pages 1135 et seq. Such apparatus are particularly useful for generating patterns on semiconductor wafers in manufacturing integrated circuits.

In known charged-particle beam optical apparatus, excitation of the condenser lens system is increased according to the relative adjustment of the mask and the specimen so that assuming the lenses are ideal, the source of the charged-particle beam is imaged as a point on the plane of the mask and thereby also on the specimen plane as a point by the projection lens system which follows. A deflection system is located above the mask so that the point probe formed by the beam scans the test opening in the plane of the mask. This generates an image of the test opening in the plane of the specimen. A detector which registers secondary electrons released at the semiconductor wafer is located in the vicinity of the specimen and generates a detector signal which is transmitted to a monitor. An image containing the adjustment marking on the specimen, as well as the image of the test opening of the mask, then appears on the screen of the monitor. In order to adjust the images on the monitor screen, the mask or the specimen is shifted until the image of the test opening and that of the adjustment marking coincide. After this adjustment, the excitation of the condenser lens system must be changed so that the mask is integrally illuminated and its entire area is imaged on the specimen. It is difficult, however, to return the condenser lens excitation in an exact manner if the condenser lens which is to be readjusted is provided with an iron shell member, as is usually the case. Also, since the condenser lens system does not consist of ideal lenses, but in contrast causes imaging errors, the image of the beam source in the plane of the mask is not a point. As a result, the test opening in the mask can be imaged in the plane of the specimen only with unavoidable poor definition. The accuracy of the adjustment is, accordingly, limited.

SUMMARY OF THE INVENTION

It is therefore an object of the present invention to provide an improved charged-particle beam optical apparatus in which the source of errors introduced by variations in the condenser lens excitation are eliminated and the imaging of the test opening in the mask on the adjustment marking of the specimen is improved.

These and other objects of the invention are achieved in a charged-particle beam optical apparatus for imaging a first mask including a plurality of apertures on a specimen to be irradiated, which mask is uniformly illuminated by a beam through a plurality of condenser lenses. The apparatus includes means for adjusting the position of the mask relative to the specimen, a selected area of which has an adjustment marking disposed thereon which is illuminated by a ray of charged particles from the beam passing through a test opening provided in the mask. The apparatus further includes means for detecting radiation emanating from the specimen. The improvement comprises a second mask, having at least one aperture which is alignable with the test opening in the first mask, mounted in the apparatus and movable into positions above and below the first mask for aligning the test opening and aperture in the first and second masks and covering the plurality of apertures in the first mask so as to permit charged particles from the beam to pass only through the test opening in the first mask and the aperture in the second mask.

In the apparatus of the invention, the condenser lens system is excited during the adjustment in the same manner as during operational imaging of the first mask on the specimen. In order to change from an adjustment condition to an operating condition, it is necessary only to remove the additional, i.e., the second mask from the ray path. Optical errors caused by the condenser lens system do not enter into the imaging of the test opening on the specimen plane and, as a result, definition of the image is correspondingly better than that produced by a point probe.

The means for detecting the radiation emanating from the specimen may comprise a detector which registers the radiation emanating from the adjustment marking on the specimen, for example, backscatter or secondary electrons, and is located in the vicinity of the specimen. The detector enables determination of the relative position of the test opening image and the adjustment marking and generates an output signal which may be measured, after amplification, for example, by an instrument. It is also possible, however, to measure the current flowing through the specimen upon illumination. A backscatter or secondary radiation of the specimen has the effect of reducing the specimen current.

In a preferred embodiment of the invention, the apparatus includes deflection means for causing movement of the ray of charged particles of the beam over the surface of the specimen, and a television monitor synchronized with the deflection means and the brightness of which is controlled by radiation emanating from the specimen. In this embodiment, the improvement of the invention further comprises the deflection means being disposed between the first mask and the specimen. This arrangement is in contrast to known optical imaging apparatus in which the deflection system synchronized with the monitor is located above the mask. The improvement of the invention enables the beam to scan a larger or smaller part of the surface area around the adjustment marking and to image the marking on the television monitor. The adjustment marking can thereby be found without mechanically shifting the mask or the specimen.

In known optical imaging apparatus, the scanning deflection system located above the mask only scans the test opening in the mask and is used for no other purpose. The image of the test opening on the specimen surface in such apparatus is not shifted. Although in such apparatus an additional deflection system is positioned between the mask and the specimen, it is excited statically only and, thus, is not synchronized with the television monitor. The purpose of this additional deflection system is to replace mechanical shifting of the mask and the specimen to achieve fine adjustment of the mask image and the specimen image by causing a deflection of the imaging beam of rays. This function can also be achieved by the deflection system used in the apparatus of the invention.

The deflection system of the inventive apparatus may be controlled so that the probe, i.e., the image of the test opening in the mask, travels over a planar area of the specimen in the form of a line raster. It should be noted, however, that it is also sufficient to cause the probe to travel only over a linear region of the specimen in the form of a so-called "line scan" and then determine the intersection of this line scan with a preferably linear adjustment marking.

The improvement of the invention operates independently of the imaging ray path between the mask and the specimen. A projection lens system consisting of two lenses, the mutual spacing of which is equal to the sum of their focal lengths (telecentral ray path) is preferably used. Such a lens system is described in the previously mentioned paper of Heritage. In this arrangement, the deflection system is preferably located in the rear focal plane of the first projection lens as it is seen in the direction of the beam.

These and other novel features and advantages of the invention will be described in greater detail in the following detailed description.

BRIEF DESCRIPTION OF THE DRAWING

The drawing is a schematic illustration of an improved charged-particle beam optical apparatus constructed according to the present invention.

DETAILED DESCRIPTION

Referring now to the drawing, there is shown a charged-particle beam optical apparatus 1 including an electron source 2, a three-stage condenser lens system 3 comprising condenser lenses a, b and c, and a projection lens system 6 comprising a long focal length intermediate lens 7 and a short focal length imaging lens 8. Lenses 7 and 8 comprise magnetic lenses and are preferably excited in equal and opposite fashion, i.e., the lenses have the same number of ampere-turns and the direction of their magnetic fields is mutually opposed, This type of excitation and the telecentric ray path causes the rotation color error, the magnification color error and the isotropic distortion in the projection lens system to become zero and the remaining errors to be at least partially eliminated.

The apparatus includes a mask 4 which is reduced imaged on a specimen 11. This specimen may comprise, for example, a semiconductor wafer. The ray path of the projection lens system is telecentric, and the rear focal plane of the intermediate lens 7 and the front focal plane of the imaging lens 8 coincide in plane 12. The mask 4 is located in the front focal plane 10 of intermediate lens 7 and specimen 11 is located in the rear focal plane 9 of imaging lens 8.

A second mask 13 is located near mask 4 and is mounted in the apparatus so that it can be swung into the ray path or removed from the ray path. This movement is achieved by any suitable drive means, indicated in the drawing by dashed lines 14. Mask 4 is provided with a plurality of apertures 4a through which the rays of the beam pass and a plurality of test openings 4b, only one of which is visible in the drawing. The second mask 13 has a fewer number of apertures 13b which are alignable and can be brought into coincidence with one or more test openings 4b in mask 4. In its position in the path of the beam of the apparatus, mask 13 covers all of the apertures 4a of mask 4. In the embodiment of the invention illustrated in the drawing, only one of the test openings 4b is uncovered. Thus, only this test opening is imaged on the specimen. Although mask 13 may be located either above or below mask 4, mask 13 has been illustrated as being positioned below mask 4 in the drawing. The advantage of this arrangement is that the entire surface area of mask 4 is continuously illuminated and, thus, maintains the same constant temperature during adjustment as during imaging. Adjustment markings are provided on the exposed surface of specimen 11 and are distinguished from the surrounding areas, for example, by high secondary electron emission. The secondary electrons emitted by the markings are detected and registered by a detector 16 located in the vicinity of the specimen. The adjustment marking corresponding to test opening 4b is identified by the reference numeral 15.

The apparatus includes a deflection system 17 which is located in the common focal plane 12 of lenses 7 and 8 and consists of two orthogonal coil pairs. When the deflection system is excited, the image of test opening 4b travels over the surface of specimen 11 and adjustment marking 15 is found by varying the excitation of the system, unless, of course, the beam of the apparatus strikes the adjustment marking immediately. Detector 16 generates an output signal which preferably controls a television picture tube monitor 18 having a deflection system 19 which is driven synchronously with the deflection system 17. If the image is deflected in raster-fashion, an image of part of the surface of the specimen including adjustment marking 15 is thereby directly obtained. Specimen 11 is then shifted until adjustment marking 15 is located using symmetrical imaging in the center of the picture, i.e., the beam strikes the adjustment marking with zero deflection excitation. In order to achieve fine adjustment, the residual deviation, which cannot be eliminated because of the unavoidable inaccuracies of mechanical drives which shift the specimen, may be compensated for by a constant excitation of deflection system 17. The relative position of the mask and the specimen is fixed in only one point by the coincidence of the image of the test opening 4b with adjustment marking 15 so established. The foregoing procedure must, as a rule, therefore be repeated using another test opening of mask 4 and another adjustment marking of specimen 11. If mask 13 is provided with only one opening 13b, which it may be, this opening can be moved to the location of the second test opening 4b by, for example, rotation of mask 13 about the optical axis 5 of the apparatus. Mask 13 may, however, also have a plurality of openings 13b which are alignable in coincidence with test openings 4b of mask 4 sequentially upon rotation of the mask 13.

As previously explained, it may be advantageous not to scan specimen 11 over its surface but instead to scan the specimen linearly in a so-called "line scan". Only one coil pair of deflection system 17 is required to achieve this. Generally speaking, a second line scan in a direction perpendicular to the first line scan will be required which can be achieved by using the second coil pair of the deflection system.

Deflection system 17 need not be positioned in the common focal plane 12 of lenses 7 and 8. It may, for example, be preferable to locate the deflection system in the center plane of lens 8. In operationally imaging the entire mask on specimen 11, it is necessary only to remove mask 13 from the ray path. The excitation of condenser lens system 3, as well as the excitation of lenses 7 and 8, remains unchanged. As a result, errors cannot occur due to variation of the optical system between adjustment and imaging. It should be noted that it may be advisable to cover test openings 4b during operational imaging.

Adjustment marking 15 may be divided on specimen 11 exclusively for the purpose of adjustment. It is, however, also possible to use structures of the specimen produced by previous processing thereof which have a useful function in the finished specimen, i.e., in an integrated circuit, as the adjustment markings. Similarly, a special opening need not be provided in mask 4 for the test opening 4b but instead one of the useful openings 4a may be utilized as the test opening.

It should be noted that the invention is not limited to use in optical imaging apparatus using magnetic lenses but that electrostatic lenses may also be utilized. The invention is also independent of the type of charged particles used to achieve imaging and is equally applicable to electron-optical apparatus and ion-optical apparatus. The apparatus of the invention is particularly adapted for reducing imaging of the mask on the specimen. The imaging scale is as a rule on the order of ten (10).

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a charged-particle beam optical apparatus for imaging a first mask including a plurality of apertures on a specimen to be irradiated, said mask being uniformly illuminated by a beam through a plurality of condenser lenses, said apparatus including means for adjusting the position of said mask relative to said specimen, a selected area of said specimen having an adjustment marking disposed thereon which is illuminated by a ray of charged particles from said beam passing through a test opening provided in said mask, said apparatus further including means for detecting radiation emanating from said specimen, the improvement comprising a second mask, having at least one aperture which is alignable with said test opening, mounted in said apparatus and movable into positions above and below said first mask, for aligning said test opening and said aperture in said first and second masks and covering said plurality of apertures in said first mask so as to permit charged particles from said beam to pass only through said test opening in said first mask and said aperture in said second mask, said condenser lenses being excited with the same excitation during an adjustment of the positions of images of said adjustment marking and said test opening on the screen of a monitor as during an operational imaging of said first mask on said specimen thereby eliminating optical errors caused by variations in the excitation of said condenser lenses during said adjustment of the positions of said adjustment marking and test opening and said imaging of said first mask on said specimen.

2. The charged-particle beam optical apparatus recited in claim 1, wherein said apparatus includes deflection means for causing movement of said ray of charged particles of said beam over the surface of said specimen, and a television monitor synchronized with said deflection means and the brightness of which is controlled by radiation emanating from said specimen, said improvement further comprising said deflection means being disposed between said first mask and said specimen.

* * * * *